US005594395A

United States Patent [19]

Niiranen

[11] Patent Number: 5,594,395

[45] Date of Patent: Jan. 14, 1997

[54] DIODE TUNED RESONATOR FILTER

[75] Inventor: Erkki Niiranen, Ii, Finland

[73] Assignee: LK-Products Oy, Kempele, Finland

[21] Appl. No.: 303,840

[22] Filed: Sep. 9, 1994

[30] Foreign Application Priority Data

Sep. 10, 1993 [FI] Finland .................................... 933987

[51] Int. Cl.$^6$ ........................................................ H03H 7/01

[52] U.S. Cl. .......................... 333/178; 333/180; 333/202; 333/175

[58] Field of Search .................................... 333/174–180, 333/202–207; 455/195.1, 197.1

[56] References Cited

U.S. PATENT DOCUMENTS

| | | | |
|---|---|---|---|
| 2,752,575 | 3/1953 | Muclary | 333/176 |
| 4,182,997 | 1/1980 | Brambilla | 333/175 |
| 4,456,895 | 6/1984 | Landt et al. | 333/174 |
| 4,662,001 | 4/1987 | Cruz et al. | 333/176 |
| 4,682,131 | 7/1987 | May | 333/202 |
| 4,714,906 | 12/1987 | D'Abaret et al. | 333/202 |
| 4,799,034 | 1/1989 | Silverman et al. | 333/202 |
| 4,965,539 | 10/1990 | Korber, Jr. | 333/176 |
| 5,019,794 | 5/1991 | Letessier et al. | 333/174 |
| 5,065,453 | 11/1991 | Thomas | 333/176 |
| 5,107,233 | 4/1992 | Stoft | 333/174 |

FOREIGN PATENT DOCUMENTS

| | | |
|---|---|---|
| 2248621 | 10/1974 | France . |
| 2247125A | 2/1992 | United Kingdom . |
| 2263583A | 7/1993 | United Kingdom . |
| 9013943 | 11/1990 | WIPO . |

OTHER PUBLICATIONS

European Search Report, EP 94 30 6651, Oct. 12, 1995.

*Primary Examiner*—Benny Lee
*Assistant Examiner*—Darius Gambino
*Attorney, Agent, or Firm*—Darby & Darby

[57] ABSTRACT

A transmission line resonator is disclosed which has a resonance frequency that is electrically controllable by control voltage. A reactive circuit is coupled in parallel between two coupling points on the transmission line resonator. The reactive value of the reactive circuit is changed by the control voltage. The reactive circuit can be inductive or capacitive. The control voltage can switch the reactive circuit in parallel with a part of the transmission line resonator between the coupling points, or can control the capacitance value of a capacitance diode disposed in parallel with a part of the transmission line resonator between the coupling points.

14 Claims, 2 Drawing Sheets

DIODE TUNED RESONATOR FILTER

FIELD OF THE INVENTION

The present invention relates to a transmission line resonator for radio frequency filters having a tunable resonance frequency.

BACKGROUND OF THE INVENTION

Using coils and capacitors as components in constructing filters is highly common In the art. As the frequency increases, the effect of the losses in the coils and capacitors starts to significantly influence the properties thereof. In particular the loss due to the internal resistance of the capacitors and the series inductance becomes significant, as well as stray capacitances and the loss resistance of the coils. In order to maintain high performance of the filters at higher frequencies than usually used with lumped elements, it is necessary to use transmission line resonators.

The use of transmission line resonators, in the present context meaning helical, coaxial or strip line resonators, in filters in the frequency range from 50 to 2,000 MHz is well known In the art. With coaxial resonators, these being typically e.g. ceramic and helical resonators, good high-frequency properties are achieved in a small volume. By coupling several resonators in succession, filters generally used in high-frequency technology can be implemented, such filters being needed in widely varying types of radio apparatus. Strip line resonators and microstrip resonators are widely used from about 1 GHz upwards. Typically in the frequency range from 50 MHz to 1.5 GHz helical resonators are used. A helical resonator is typically fabricated from a winding of silver coated copper wire insulated by air from a metal coated housing into which the coil is placed.

The manufacturers of radio apparatus insist on filters being smaller in height, or at least in volume than before, and in spite of that, still having as good a performance as before. A smaller filter volume can be obtained by reducing the number of the resonators in the filter or by implementing the filter using resonators of smaller size. Reducing the number of resonators is often near impossible in practice, and reducing their size means in practice that the resonators are replaced by resonators with electrically poorer properties.

In vehicular and mobile hand phones used in cellular telephone systems, various different filters are used. In the NMT phones used in Scandinavia, a bandwidth of 25 MHz is in use whereas in the E-TACS system used in Great Britain the bandwidth is 33 MHz. Due to the bandwidth and certain technical reasons required by the system, the size of the filters manufactured for E-TACS system is greater than e.g. in filters for NMT and AMPS (the US system). Typically, an Rx filter of an NMT handphone comprises four resonators whereas an equivalent Rx filter of an E-TACS hand phone can be implemented with five resonators. The number of poles required for the other filters of a phone are also much higher in the E-TACS system than in the other systems.

It is also known in the art that with a reduction in size of a resonator there is a corresponding drop in quality factor. This in turn leads to increased bandpass attenuation in the filters, which is undesirable. Since the features of a filter deteriorate along with the reduced quality factor of the resonators when their size is reduced, other methods to substitute them have to be adopted. Therefore, a number of different procedures have been introduced for tuning the frequency of a resonator.

In Finnish patent application No. 913088 a method is disclosed to transfer the specific curve of a ceramic resonator in the frequency plane. Therein, in the electromagnetic field of a resonator, called the main resonator, a second resonator called side resonator is positioned. One end of the side resonator is coupled with a controllable switch to the earth of the circuit or off the earth. When the switch is open, the side resonator serves as a resonator the resonance frequency whereof being at a distance from the resonance frequency of the main resonator, and when the end has been earthed, the resonance of the side resonator approaches the resonance frequency to the main resonator, causing therein a frequency transfer.

Tuning a resonator frequency by positioning a series connection of an inductance and a capacitance diode within the resonator field is described in patent application GB 2,141,880. Therein on the end surface of a dielectric resonator operating in the Giga Hertz range there is placed a closed loop, comprising two inductances and capacitance diodes connecting the inductances. By changing the capacitance of the diodes with an external control voltage, the inductance of the loop changes and this change thereof leads to a change in the resonance frequency of the resonator. The change can be up to 50 MHz.

Another procedure in which a resonance circuit is positioned in the field of the resonator, the resonance frequency whereof being changed by changing the capacitance of the capacitance diode, is disclosed in patent application GB-2 153 598.

In the prior art apparatus, the coupling of a main resonator to a side or secondary resonator is typically by means of electromagnetic coupling. It is difficult to size in advance by means of calculation a frequency tuning circuit, and even minor divergences in the physical location thereof relative to the main resonator affect the properties of the coupling. Such coupling and accurate repeatable tuning thereby requires that the positions of the respective resonators can be accurately repeated. However, this is difficult in practice and leads to variations in the tunability of the resonators and their resonance frequencies, thereby complicating the manufacture of filters made from such resonators since the variations have to be compensated for at some point during manufacture, or even later.

SUMMARY OF THE INVENTION

According to the present invention, there is provided a transmission line resonator having a reactance selectively connectable in parallel thereto, wherein said reactance is conductively coupled to said transmission line resonator.

This has the advantage in that it provides an electrical frequency control coupling in the transmission line resonator, which in practice is simple to implement and which enables the reduction of the size of the filter without damaging the electrical properties.

Furthermore, the reactance may be coupled in a region of the transmission line resonator having a low radio frequency voltage. This makes the use of a varactor possible and efficient, since only a low bias current is required to overcome and bias current due to parasitic rectification of the radio frequency voltage.

From the point of view of a radio phone manufacturer, it would be advantageous if the filters of different systems were physically of equal size, whereby the manufacturers of the phones could use similar circuit board sizes upon which the components of a phone can be installed. Thus, considerable savings can be obtained since one circuit board, appropriate for all phones, need only be designed. Similarly, the number of components can be reduced and considerable savings can be achieved.

In accordance with a first embodiment, the reactive circuit consists of a serial connection consisting of a reactive element and the switch to be controlled. The state of the switch is controlled by external control direct voltage. With an open switch, the reactive element exerts no effect on the resonance frequency of the resonator. When the switch is controlled to be switched off, said partial length of the resonator is replaced by the parallel connection of the reactive element and the inductance of the partial length. Depending on whether the reactive element is an inductance or a capacitance, the overall inductance of the parallel connection increases or decreases: if the reactive element is a capacitance, the inductance of the parallel connection is higher than the inductance of the partial length of the mere resonator. In such instance, the resonance frequency of the transmission line resonator has increased. If the reactive element is an inductance, parallel connection of two inductances is in question, whereby the inductance of the transmission line resonator decreases and the resonance frequency decreases. Thus, the connection makes a direct impact on the electrical length of the resonator, i.e. on the inductance thereof, but the electromagnetic field of the resonator is not effected, as in the state of art designs.

Particularly in applications in which great power is processed, a PIN diode can be used as a switch. A PIN diode can be controlled to be conducting by supplying direct current therethrough. When current is conducted through the diode, the high resistance Rj of the diode interface turns from several kilo ohms into a few ohms, depending on the magnitude of the current passing through the diode, and being the smaller the higher the biasing current. Roughly speaking, the PIN diode can be considered as a controllable resistor, the resistance value whereof can be varied from near zero into several kilo ohms.

In accordance with a second embodiment, the reactive circuit comprises a capacitance diode, the capacitance value whereof is controlled by means of an external control direct voltage carried to the cathode thereof. The capacitance diode may also be connected in series with a capacitor for an appropriate control range. When the capacitance of the varactor is enlarged, the inductive reactants increases when viewed at the ends of the part of the transmission line resonator in parallel wherewith the reactive circuit has been connected. As a result thereof, the resonance frequency of the resonator decreases, and when the capacitance of the capacitance diode is, in turn, decreased, the inductive reactance decreases, thus increasing the resonance frequency of the resonator. If greater frequency control of the resonator is desired, the value of the capacitor in series with the capacitance diode or the capacitance range of the capacitance diode can be increased. The capacitance range can be increased by employing a greater change of the biasing voltage or by selecting a new capacitance diode.

DETAILED DESCRIPTION OF EMBODIMENTS OF THE INVENTION

Figure 1:
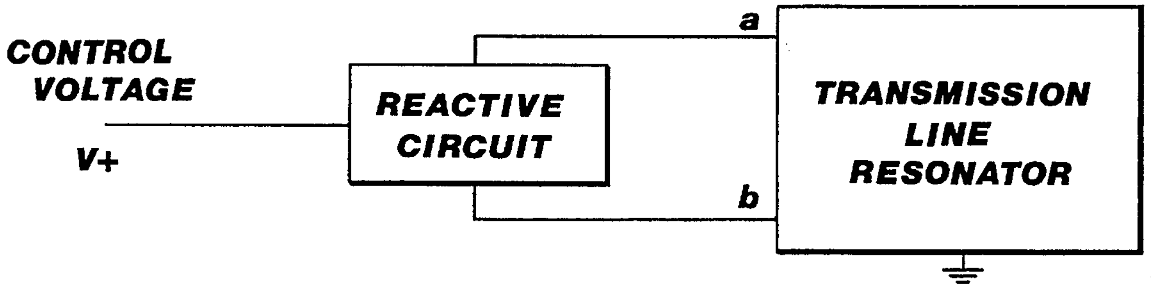
FIG. 1 presents the basic idea of the invention.

FIG. 1 shows reduced the basic idea of the present invention. Therein, in parallel with part of the length a-b of a transmission line resonator, being a quarter wave in length in this case, a reactive circuit has been connected. An external control voltage enters the reactive circuit, a change in which causes a change in the reactance value of the circuit. As a result, a reactance value measured from points a,b changes in comparison with a reactance change of the reactive circuit, and in addition, a change in the inductance value of the transmission line resonator occurs. That results in a change in the resonance frequency.

Figure 2:
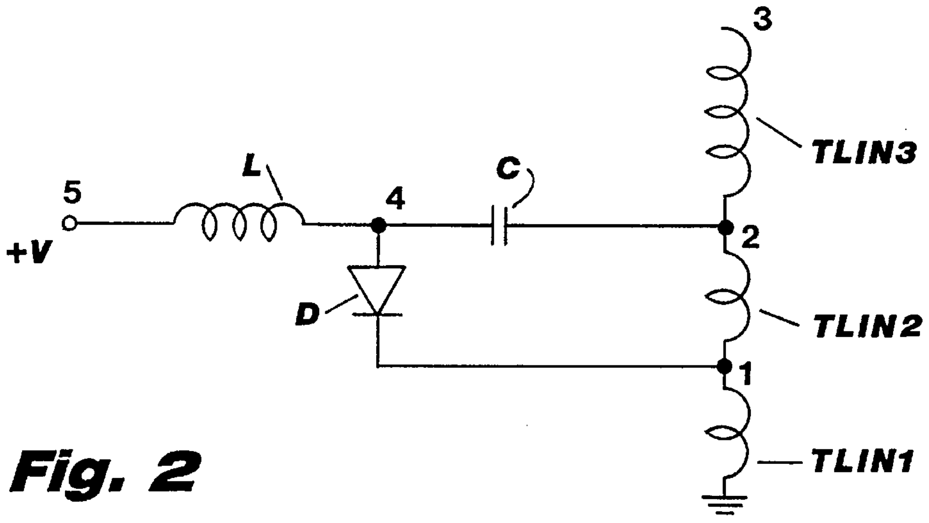
FIG. 2 illustrates a first embodiment in which the reactance circuit to be coupled is capacitative, FIG. 3 present a first embodiment in which the reactance circuit to be coupled is inductive.

FIG. 2 shows, according to the first embodiment, a transmission line resonator, a helical resonator in the present case, which as is known in the art comprises a conductor wound in the shape of a cylindrical coil and earthed at the other end. The conductor has been positioned in a metallic housing sewing as an earth level and whereto the other end of the coil is earthed. The other end 3 is open, and a given capacitance is prevalent therebetween and the box, a so-called loading capacitance. At a given point, parallel to the resonator conductor, in parallel with the resonator part TLIN2 between points 1 and 2 in the figure, a series connection composed of a reactive element according to the invention, of capacitor C and switch D in the figure, has been connected. Main part of the resonator length forms part TLIN3, and the part TLIN1 between point 1 and the earth is fairly short.

Switch D is a PIN diode, to the anode of which, to point 4, external control direct voltage V is carried via coil L from terminal 5. The value of the inductance of coil L is so selected that the parallel resonance of the coil occurs on the frequency being used at each moment. If the resonance frequency of the resonator is about 900 MHz, the parallel resonance of e.g. a surface connected coil with a value of 220 nH, varies in the range of about 900 MHz, whereby the impedance thereof is very high, and as a result thereof, the entry of a 900 MHz signal from the resonator into V+ voltage supply line is inhibited.

When the control voltage V is raised to an appropriate value, the PIN diode D changes from unconducting (idle state) state into conducting state, in which the resistance thereof is very small. The transmission line resonator is thus composed of the parts TLIN1, TLIN2 and TLIN3 of the transmission line.

Let the inductance of the transmission line resonator TLIN1 and TLIN2 be 5 nH and of TLIN3, 70.17 nH. The capacitance visible at the end 3 of TLIN3 against the earth plane is 0.39 pF, whereby the parallel resonance frequency of the transmission line resonator is 900 MHz. When the PIN diode is unbiased, the resistance of the interface of the diode is very high (e.g. 10 k ohm), whereby the effect thereof on the resonance frequency of the resonator is insignificant. When low direct current is conducted through the diode, the resistance Rj of the interface of the diode becomes very small. Hereby, a low resistance is connected in parallel with TLIN2 via capacitor C, let it be 3 ohms. The inductance of a parallel circuit C-Rj TLIN2 thus produced will in this case be 6.58 nano henry. Thus, the inductance of TLIN2 and of the coupling in parallel therewith has grown from 5 nH to 6.58 nH, whereby the inductance of the transmission line has grown equally. Hereby, the new resonance frequency of the circuit is 892.3 MHz, i.e. the frequency moves downwards by about 7.7 MHz. The magnitude of a frequency change can be affected by varying the location of TLIN2, that is, of coupling points 1 and 2, and changing the values of C. If a great change of the frequency is desired in the resonance frequency of the transmission line resonator, the value of the capacitor C can be increased or the electric length of the transmission line resonator TLIN2 can be added.

Figure 3:
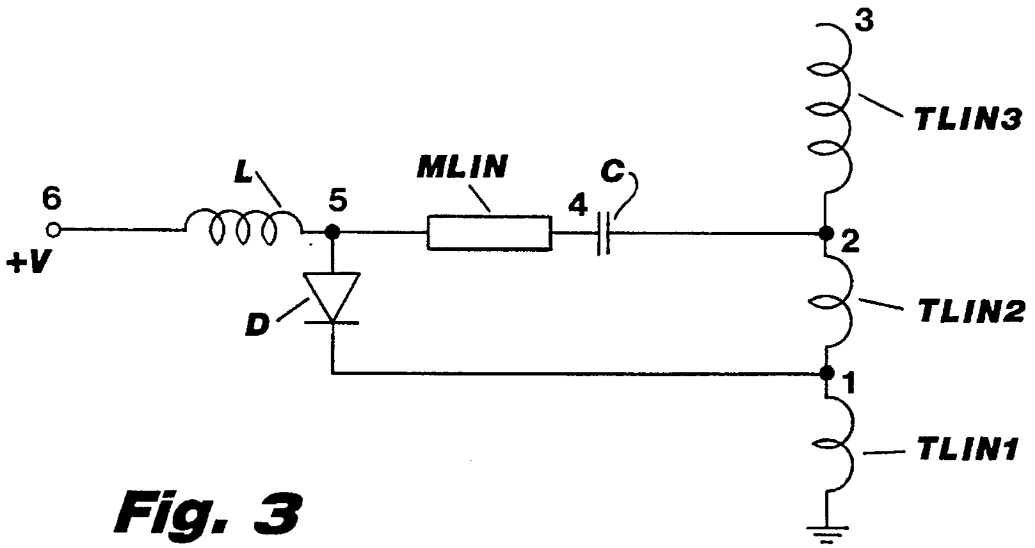
Figure 4:
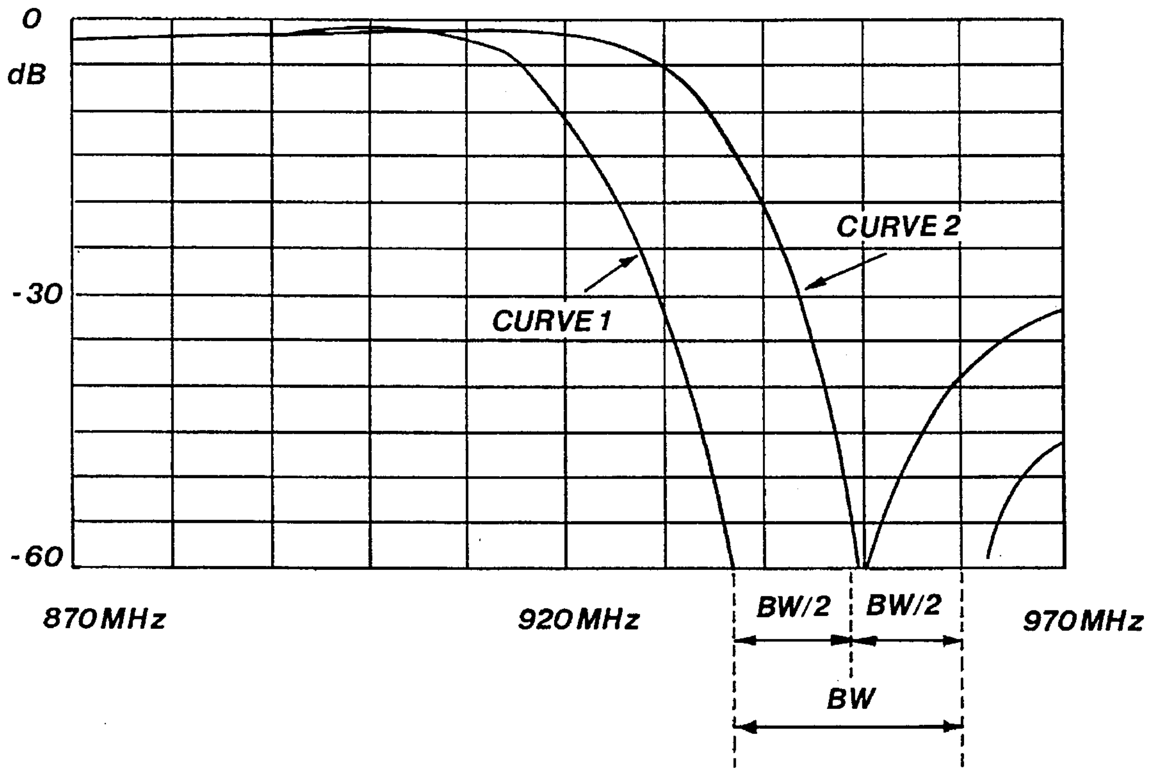
FIG. 4 shows an amplitude response of a filter in which a frequency transfer circuit according to the first embodiment is used.

FIG. 3 presents a variation of the first embodiment. The reactive element connected in parallel with part TLIN2 of the transmission line is a microstrip MLIN provided with a given inductance, end the parallel connection comprises therefore a series connection of that part, capacitor C and PIN diode. The purpose of capacitor C is merely to inhibit the entry of the supply voltage V directly via the resonator to the earth. When the PIN diode D is not conducting, i.e. the supply voltage is zero, the parallel connection has no effect on the resonance frequency of the transmission line, this being about 900 MHz in the component values of FIG. 1. Since the diode has now been made conducting by the connection of positive voltage V, a series connection of a low-level resistance Rj represented by the PIN diode and the microstrip conductor is coupled in parallel with TLIN2. The inductance of the parallel circuit Rj-MLIN-C-TLIN2 thus produced is 3.33 nH if the component values are as follows: Rj=3 ohms, L4M6IN=100 nH, C=100 pF, and the inductance of TLIN2 is 5 nH. Thus, the inductive reactance of the part of the transmission line between points 1 and 2 has decreased from nH into 3.3 nH. The same decrease is visible in the entire resonator, so that the resonance frequency of the resonator moves upwards into frequency 909.5 MHz, i.e. the frequency moves upwards by about 9.5 MHz, In a filter structure, implemented with resonators as those in FIG. 2, the amplitude response of the filter is, when the PIN diode is unconducting, similar to that shown in FIG. 4, and behaving is shown in curve 2. It can be seen that the frequency of the resonators is lower in the idle state than in the state in which the PIN diodes have been made conducting, whereby a curve as that in curve 1 is produced as the response of the filter, that is, the frequency has turned upwards.

Using the design of said embodiment, a 4-circuit transmitter filter is implemented, the properties whereof being pass attenuation of 1.7 dB and the reverse attenuation 65 dB when the equivalent filter, while fixed, is 2.1 dB in pass attenuation and 65 dB in reverse attenuation. In addition to a decrease in pass attenuation, the volume of the filter has gone down from 6.4 $cm^2$ to 4.5 $cm^2$. Thus, the filter can be implemented in a smaller size and provided with better features, this being enabled by the fact that the width of the reverse area of the filter need not be more than half of the entire reverse band width available. The amplitude response of the filter shown in FIG. 4 indicates that with unconducting diodes (curve 2) the width of the reverse band is Bw/2. By moving the resonators to on another resonance frequency, so that the amplitude response is as in curve 1, the width of the reverse band is in this case also Bw/2. Hereby, by means of an electric control according to the invention the reverse band of the width Bw can be covered. Without any control, the resonators of the filter would be greater in size, a greater number of resonators may have to be used, and the pass attenuation would be poorer.

Figure 5:
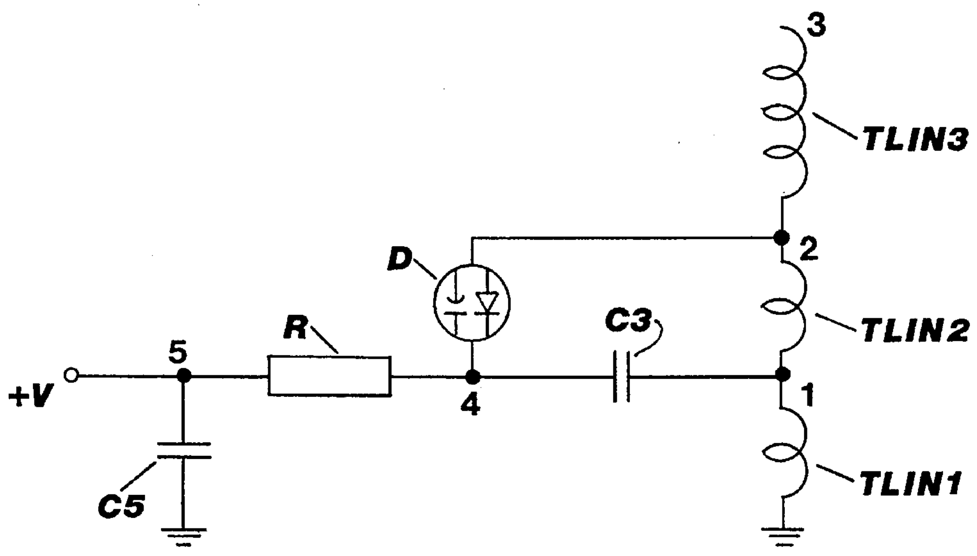
FIG. 5 shows a reactive circuit according to the second embodiment.

A second embodiment of the invention is presented in FIG. 5. The reference numerals are, whenever applicable, the same as in FIGS. 2 and 3. As above, the helical resonator has been divided into three parts: $TLIN_1$ between point 1 and earth, $TLIN_2$ between points 1 and 2, $TLIN_3$ between points 2 and 3. A reactive circuit coupled between points 1 and 2 now consists of a capacitance, of a series connection of capacitance diode D and capacitor C3 in the present picture. A capacitor $C_3$ has been coupled to the resonator from point 1 to point 4, to affect therethrough the size of the control range of the reactive circuit. Resistor R has been coupled between points 4 and 5, and the direct voltage required in controlling the capacitance diode is supplied therethrough, while it separates the control voltage of the rf signal from the supply circuit. The function of capacitor $C_5$, coupled between point 5 and the earth of the circuit, is to shortcircuit the weak rf signal passed through the resistor R to the earth.

For examining the operation of the second embodiment of FIG. 5, the operation of the circuit is examined and the resonator is considered as the LC circuit which in the proximity of the resonance frequency can be considered as a parallel resonance circuit formed by a coil and a capacitor. Let the inductance of $TLIN_1$ be 10 nH, the inductance of $TLIN_2$ 10 nH, and that of $TLIN_3$ 60.19 nH, and the capacitance value of the resonator when measured from the top against the earth is 0.39 pF. The value of the capacitor $C_3$ in series with capacitance diode D is 3.3 pF. A varactor is available, the capacitance whereof can be controlled to vary in the range between 18 pF and 11 pF.

At the above component values and when the capacitance diode has been controlled to be at capacitance value of 18 pF, 791.018 MHz and 1146.288 MHz are obtained for the resonance frequencies of the circuit. It goes without saying that of said two resonance frequencies only one is selected to be used. When for the value 11 pF of the capacitance diode is then controlled with external direct voltage V+, 804.482 MHz and 1180.162 MHz are provided for the frequencies of the resonance circuit. The resonance frequency of the resonator can thus be controlled by means of the above component values, of appr. 13.4 MHz, and the other resonance frequency of appr. 33.8 MHz.

In the circuit, the reactance of a part of the resonator, here of the part between points 1 and 2 is changed, which is inductive, whereby by changing the capacitance of the varactor, the inductive reactance of the resonator part between points 1 and 2 is in fact changed. When increasing the capacitance of the varactor, said inductive reactance increases, whereby the resonance frequency of the resonator decreases, and when reducing the capacitance of the capacitance diode, said inductive reactance decreases, so increasing the resonance frequency.

When a greater frequency control of the resonator is desired, the value of the capacitor in series with the capacitance diode or the capacitance range of the capacitance diode can be increased. The capacitance range can be increased using a greater change in the biasing voltage or by selecting a new capacitance diode. Said operation may also be implemented by increasing the inductive reactance of the capacitance diode and the part of the resonator in parallel with the capacitor in series therewith.

Using the design of the present Invention, band stop and band pass filters, and combinations thereof can be constructed. In the filters one or more resonator designs according to the invention can be employed, whereby with the first embodiment, one or more resonators can be adjusted between the idle position and the control position, or with the second embodiment, the frequency control is gliding. Particularly in duplex filters, in which the filter consists of two branches, that is, a transmitter (RX) and a receiver branch (TX), the filter design of the invention can be used in both filters. It is most preferred to use controllable resonators in the TX filter in which higher power levels are processed, whereby maintaining the pass attenuation as small as possible is economical.

Particularly in a filter in accordance with the second embodiment, the quality factors of the resonators of the filter need not be as high as in the fixed filters because the filter can be used, as regards the pass band, so that the peak of the penetration curve of the filter is set, i.e. the point at which the pass attenuation is smallest, to be located at the frequency of said desired signal. Herewith, considerable advantage is gained with such controllable design, as regards the operation of the apparatus, because the fixed filters have greater attenuation, particularly on the edges of the pass band of the filter than in the middle of the band. One of the advantages of the invention is also the minimal power it consumes. It is known in the art that the capacitance diodes have been biased to be reverse in direction, so that the current passing therethrough is minimal, neither is there any need to heed the power consumption of the filter when examining the power consumption of the entire apparatus.

In view of the foregoing description it will be evident to a person skilled in the art that various modifications may be made within the scope of the invention. For example, a transmission line resonator need not be a helical resonator; instead, it can be an LC, coaxial or strip line resonator, depending on the purpose.

The scope of the present disclosure includes any novel feature or combination of features disclosed therein either explicitly or implicitly or any generalisation thereof irrespective of whether or not it relates to the claimed invention or mitigates any or all of the problems addressed by the present invention. The applicant hereby gives notice that new claims may be formulated to such features during prosecution of this application or of any such further application derived therefrom.

What I claim is:

1. A filter, comprising:

a transmission line resonator;

a reactance; and coupling means for selectively coupling said reactance in parallel with a portion of said transmission line resonator such that said reactance is conductively coupled to a part of said transmission line resonator between two coupling points along a part of the length of the transmission line resonator.

2. A filter according to claim 1, wherein said coupling means couples said reactance to said transmission line resonator in response to a control voltage.

3. A filter according to claim 2, wherein said reactance and said coupling means form a series circuit, and wherein said reactance is an inductive component and said coupling means is a controllable switch.

4. A filter according to claim 3, wherein the inductive component is a strip line.

5. A filter according to claim 2, wherein the reactance and said coupling means form a series circuit, and wherein said reactance is a capacitor and said coupling means is a controllable switch.

6. A filter according to claim 2, wherein said coupling means is a PIN diode and the cathode thereof is coupled to one of said two coupling points of the transmission line resonator, and the control voltage is coupled to the anode of the PIN diode.

7. A filter according to claim 1, wherein the reactance comprises a capacitance diode coupled in parallel with said part of the length of the transmission line resonator, and wherein a cathode of the capacitance diode is coupled to a control voltage.

8. A filter according to claim 7, wherein the reactance further includes a capacitor connected in series with the capacitance diode, the control voltage being conducted to a point therebetween.

9. A radio frequency filter, comprising:

at least two transmission line resonator circuits;

at least one of said transmission line resonator circuits being controllable by a control terminal to which a control voltage is selectively applied to change the resonance frequency thereof;

a reactance coupled in parallel between two coupling points along a part of the length of the controllable transmission line resonator circuit, said control terminal being operatively coupled to said reactance to change the value of the reactance in response to a selectively applied control voltage.

10. A radio frequency filter according to claim 9, wherein the reactance is a series circuit formed by an inductive element and a controllable switch, the control voltage being applied to said controllable switch.

11. A radio frequency filter according to claim 9, wherein the reactance is a series circuit formed by a capacitive element and a controllable switch, the control voltage being applied to said controllable switch has a first value, the switch is shut and the reactive circuit is electrically coupled in parallel with said part.

12. A radio frequency filter according to claim 10, wherein the controllable switch is a PIN diode having a cathode thereof coupled to one of said two coupling points and wherein the control voltage is connected to an anode of the PIN diode.

13. A radio frequency filter according to claim 9, wherein the reactance comprises a capacitance diode in series with said part of the length of the controllable transmission line resonator circuit, said capacitance diode having a cathode coupled to the control voltage.

14. A transmission line resonator having a resonance frequency which is controlled by a selective application of a control voltage, comprising:

a PIN diode having a cathode electrically coupled to a first point on the transmission line resonator and an anode which is selectively connectable to the control voltage; and a reactance having one end electrically coupled to a second point on the transmission line resonator and another end electrically connected to said anode, said first and second coupling points including only a part of the length of the transmission line resonator, whereby said reactance is conductively coupled in parallel to said part of the length of the transmission line resonator only when said anode is connected to the control voltage and said PIN diode conducts to change the resonance frequency of the transmission line resonator.

* * * * *